United States Patent
Graettinger (10) Patent No.: US 7,126,182 B2
(45) Date of Patent: Oct. 24, 2006

(54) MEMORY CIRCUITRY

(75) Inventor: Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 10/918,613

(22) Filed: Aug. 13, 2004

(65) Prior Publication Data

US 2006/0033140 A1    Feb. 16, 2006

(51) Int. Cl.
*H01L 27/108* (2006.01)
(52) U.S. Cl. .............. 257/306; 257/309; 257/310; 257/296; 257/E27.086; 438/253; 438/396
(58) Field of Classification Search ............ 257/306, 257/309, 310, 296, E27.086; 438/253, 396
See application file for complete search history.

(56) References Cited

U.S. PATENT DOCUMENTS

| | | | |
|---|---|---|---|
| 5,766,994 A * | 6/1998 | Tseng .................... | 438/254 |
| 5,843,830 A | 12/1998 | Graettinger et al. | |
| 5,844,771 A | 12/1998 | Graettinger et al. | |
| 5,930,639 A | 7/1999 | Schuele et al. | |
| 5,960,294 A * | 9/1999 | Zahurak et al. ........... | 438/398 |
| 5,981,334 A * | 11/1999 | Chien et al. ............... | 438/253 |
| 6,033,950 A | 3/2000 | Chen et al. | |
| 6,049,101 A | 4/2000 | Graettinger et al. | |
| 6,093,617 A * | 7/2000 | Su et al. ................... | 438/398 |
| 6,146,961 A | 11/2000 | Graettinger et al. | |
| 6,171,925 B1 | 1/2001 | Graettinger et al. | |
| 6,265,260 B1 * | 7/2001 | Alers et al. ............... | 438/240 |
| 6,297,528 B1 | 10/2001 | Chen et al. | |
| 6,309,973 B1 | 10/2001 | Fischer et al. | |
| 6,340,622 B1 | 1/2002 | Lee et al. | |
| 6,348,709 B1 | 2/2002 | Graettinger et al. | |
| 6,358,857 B1 | 3/2002 | New | |
| 6,372,667 B1 | 4/2002 | Lee | |
| 6,403,413 B1 * | 6/2002 | Hayano et al. ........... | 438/238 |
| 6,482,736 B1 | 11/2002 | Basceri et al. | |
| 6,492,241 B1 | 12/2002 | Rhodes et al. | |
| 6,518,117 B1 * | 2/2003 | Ping et al. ................ | 438/239 |
| 6,580,114 B1 | 6/2003 | Graettinger et al. | |
| 6,682,969 B1 | 1/2004 | Basceri et al. | |
| 6,689,657 B1 | 2/2004 | Gealy et al. | |
| 6,696,718 B1 | 2/2004 | Gealy et al. | |
| 6,825,081 B1 * | 11/2004 | Zheng ....................... | 438/253 |
| 6,967,135 B1 * | 11/2005 | Lee .......................... | 438/239 |
| 6,967,154 B1 * | 11/2005 | Meng et al. ............... | 438/622 |
| 2001/0044181 A1 | 11/2001 | Nakamura | |
| 2002/0025680 A1 | 2/2002 | New | |
| 2002/0084480 A1 * | 7/2002 | Basceri et al. ............ | 257/306 |

(Continued)

*Primary Examiner*—B. William Baumeister
*Assistant Examiner*—Steven J. Fulk
(74) *Attorney, Agent, or Firm*—Wells St. John P.S.

(57) ABSTRACT

The invention includes memory circuitry. In one implementation, memory circuitry includes a memory array comprising a plurality of memory cell capacitors. Individual of the capacitors include a storage node electrode, a capacitor dielectric region, and a cell electrode. The cell electrode is commonly shared among at least some of the plurality of memory cell capacitors within the memory array. The cell electrode within the memory array includes a conductor metal layer including at least one of elemental tungsten, a tungsten alloy, tungsten silicide and tungsten nitride. Polysilicon is received over the conductor metal layer. The conductor metal layer and the polysilicon are received over the storage node electrodes of said at least some of the plurality of memory cell capacitors. Other aspects and implementations are contemplated.

58 Claims, 3 Drawing Sheets

U.S. PATENT DOCUMENTS

2002/0160559 A1    10/2002  Lee et al.
2002/0160565 A1*   10/2002  Lee ............................ 438/240
2003/0178665 A1*    9/2003  Takenaka .................... 257/306
2003/0199139 A1*   10/2003  Lee ............................ 438/240
2004/0053474 A1     3/2004  Shin et al.
2004/0137678 A1     7/2004  Cho et al.
2004/0248362 A1*   12/2004  Nakamura et al. .......... 438/241
2006/0020828 A1     8/2005  Graettinger
2005/0268618 A1    12/2005  Shin et al.

* cited by examiner

F I G 2

FIG. 3

MEMORY CIRCUITRY

TECHNICAL FIELD

This invention relates to memory circuitry.

BACKGROUND OF THE INVENTION

There are many different types of memory integrated circuitry. Some of such circuitry utilizes a plurality of memory cell capacitors received within a memory array (including meaning sub-arrays) of such capacitors. Individual of the capacitors include a storage node electrode, a cell electrode, and a capacitor dielectric region received therebetween. Further in some memory circuitry, the cell electrode is commonly shared among the capacitors within a memory array. By way of example only, one existing such type of memory circuitry is dynamic random access memory (DRAM). Regardless, the memory cell capacitors which are fabricated can be of any of various shapes, including stacked, trenched, planar, and including those that have at least their capacitor storage nodes formed in a container or cup-like shape.

An existing prior art memory cell capacitor construction forms the storage node electrode of titanium nitride, and with a capacitor dielectric region comprising one or a combination of aluminum oxide and hafnium oxide. The other cell electrode is composed of three materials, namely a titanium nitride layer received on the capacitor dielectric region, conductively doped polysilicon received on the titanium nitride, and tungsten silicide received on the conductively doped polysilicon. The titanium nitride is utilized due to its extremely high step coverage during deposition to within container openings and to provide a good adhesion and barrier layer to the doped silicate glasses within which the storage node container openings are typically formed. Polysilicon also provides good conformal step coverage during deposition, and also in part functions as an oxidation barrier. Further, the conductive cell electrode layers are typically utilized for fabricating other conductive components or portions of conductive components in circuitry peripheral to the memory array. The polysilicon of such components provides a good etch stop function for etching contacts to these conductive materials in circuitry peripheral to the memory array. Tungsten silicide is utilized over the polysilicon because of its considerably higher electrical conductivity as compared to that of conductively doped polysilicon. Tungsten silicide is typically physical vapor deposited.

The typical above prior art memory cell capacitor construction forms the titanium nitride of the cell electrode in the form of a continuous layer which lines all of the trenches over the capacitor dielectric region. A layer of conductively doped polysilicon then completely fills the remaining volume of the containers and interconnects with all of the containers of an array. The tungsten silicide layer is received thereover, and accordingly not within the containers. One or more conductive contacts to this cell plate layer is typically made externally of the memory array, typically for providing the cell electrode at a common potential throughout the array.

Utilization of aluminum and/or hafnium oxides has tended to limit the temperature to which the substrate can be exposed subsequently. Specifically, a typical upper temperature limit is 700° C. Borophosphosilicate glass (BPSG) is a typical interlayer/interlevel dielectric which is usually deposited before and after deposition of an aluminum oxide and/or hafnium oxide. BPSG is conventionally subjected to rapid thermal processing and furnace annealing after its deposition, something which typically occurs at temperatures at or above 800° C. Such high temperature processing also advantageously provides activation of the conductivity enhancing impurity dopants within the polysilicon, something which increases the electrical conductivity of the doped polysilicon considerably. However with the present 700° C. temperature limit after deposition of aluminum oxide and/or hafnium oxide, the BPSG is subsequently deposited without furnace annealing or rapid thermal processing exposure. This results in a less than desired degree of dopant activation in the polysilicon and, correspondingly, higher resistance in the polysilicon than is desired.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes memory circuitry. In one implementation, memory circuitry includes a memory array comprising a plurality of memory cell capacitors. Individual of the capacitors comprise a storage node electrode, a capacitor dielectric region, and a cell electrode. The cell electrode is commonly shared among at least some of the plurality of memory cell capacitors within the memory array. The cell electrode within the memory array comprises a conductor metal layer comprising at least one of elemental tungsten, a tungsten alloy, tungsten silicide and tungsten nitride. Polysilicon is received over the conductor metal layer. The conductor metal layer and the polysilicon are received over the storage node electrodes of said at least some of the plurality of memory cell capacitors.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
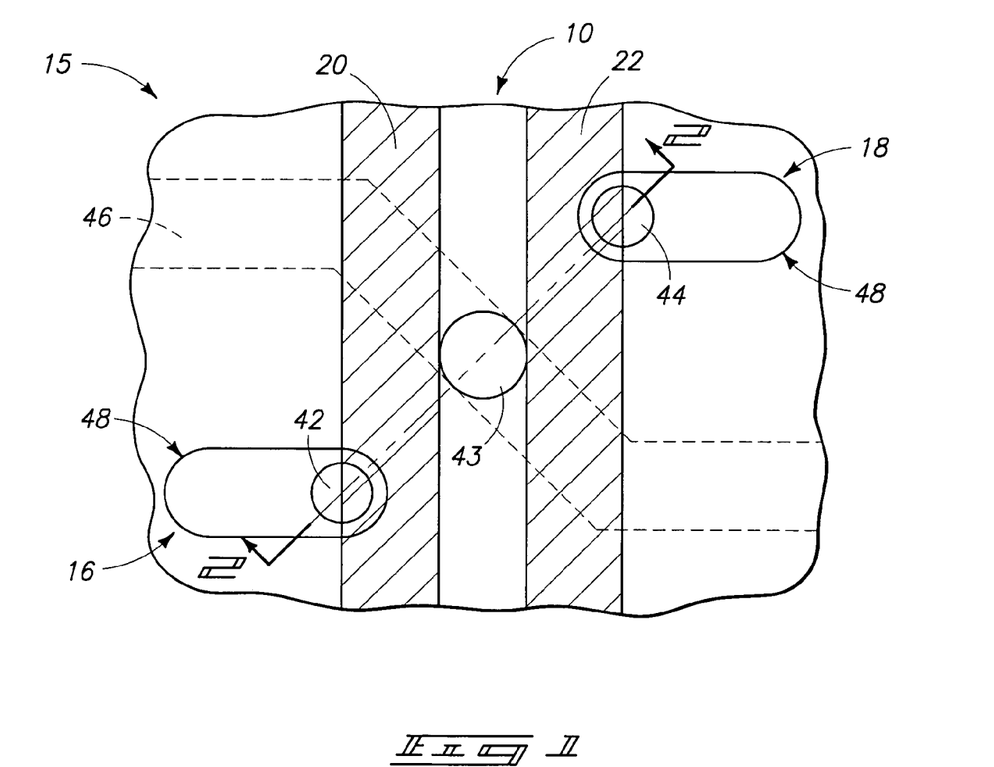
FIG. 1 is a diagrammatic top plan view of a portion of a semiconductor wafer fragment in accordance with an aspect of the invention.
Figure 2:
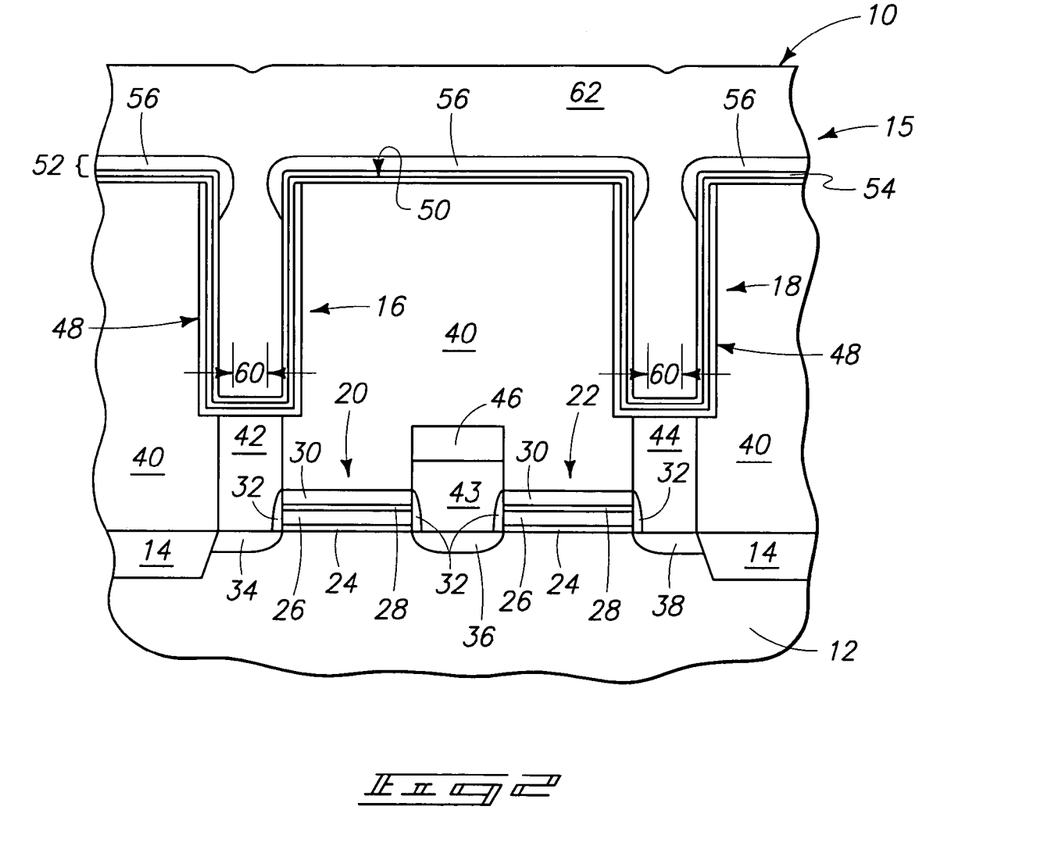
FIG. 2 is a diagrammatic sectional view taken through line 2—2 in FIG. 1.

Preferred embodiment memory circuitry, for example DRAM circuitry, is initially described with reference to FIGS. 1 and 2 where a semiconductor substrate fragment is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises bulk monocrystalline silicon 12 having trench isolation regions 14 formed therein. Of course, alternate semiconductor substrates (for example semiconductor-on-insulator) are contemplated, and whether existing or yet-to-be developed.

The particular exemplary illustrated memory circuitry depicts two memory cells of DRAM circuitry, and particularly, buried digit line DRAM circuitry. However, any memory circuitry is contemplated, whether existing or yet-to-be developed, that at least includes some memory array 15 which comprises a plurality of memory cell capacitors, and as will be apparent from the continuing discussion. Substrate fragment 10 depicts a portion of a memory array 15 comprising a plurality of capacitors, with two such capacitors 16 and 18 being shown. A pair of wordlines 20 and 22 is depicted as being received over semiconductive material 12. By way of example only, such are depicted as comprising a gate dielectric layer 24, a conductively doped polysilicon layer 26 received thereover, a more conductive refractory metal or refractory metal silicide layer 28 received thereover, and an insulative cap 30 (i.e., silicon nitride) received over layer 28. Anisotropically etched sidewall spacers 32 are shown insulating the sidewalls of wordlines 20 and 22. Conductive diffusion regions 34, 36 and 38 are provided within semiconductive material 12. Diffusion region 36 is received between wordlines 20 and 22, and constitutes a shared bit node/junction for the two memory cells. Diffusion regions 34 and 38 are received laterally outward of wordlines 20 and 22, respectively, and comprise storage node junctions for the two depicted memory cells.

One or more insulative materials 40 have been formed over substrate 12, including wordlines 20 and 22, in the depicted exemplary embodiment. An exemplary preferred material or materials include silicon dioxides including, most preferably, insulative silicate glasses such as BPSG and phosphosilicate glass (PSG). In the depicted example, and whether one material or a collection of different materials, material 40 will typically be deposited in multiple steps. Conductive contacts or plugs 42, 43 and 44 are depicted as being received within material or materials 40, and extend to diffusion regions 34, 36 and 38, respectively. Such might comprise one or more conductive materials, for example conductively doped polysilicon, titanium nitride and titanium silicide. Materials 42, 43 and 44 might be the same as one another or different. By way of example only, such might be formed within contact openings formed after an initial deposition of undoped silicon dioxide followed by the deposition of BPSG. FIGS. 1 and 2 also depict a buried digit line 46 with respect to the exemplary memory circuitry being described.

Individual capacitors 16 and 18 are depicted as comprising a storage node electrode 48, a capacitor dielectric region 50, and a cell electrode 52. Cell electrode 52 is commonly shared among at least some of the plurality of memory cell capacitors within the memory array, with FIG. 2 depicting cell electrode 52 being shared by memory cell capacitors 16 and 18 within memory array 15.

An exemplary preferred storage node electrode material is a conductive metal nitride, for example titanium nitride. Such electrodes might comprise, consist essentially of, or consist of an exemplary conductive metal nitride. By way of example only, alternate exemplary conductive metal nitrides include tungsten nitride, titanium boron nitride, and tantalum nitride. An exemplary preferred thickness range for storage node 48 is from 50 Angstroms to 100 Angstroms. Further and regardless, in the depicted preferred embodiment, storage node electrodes 48 comprise a container shape. Further in one preferred embodiment, such container shaped storage node electrodes are received within container openings formed within an insulative silicate glass, such as the depicted exemplary material 40.

An exemplary preferred capacitor dielectric region 50 comprises at least one of aluminum oxide and hafnium oxide. By way of example only, further exemplary preferred dielectrics include tantalum oxides, tantalates, titanates such as barium strontium titanate, and oxide-nitride-oxide (ONO) materials.

In the depicted preferred embodiment, cell electrode 52 comprises a conductive metal nitride layer 54 and a conductor metal layer 56 comprising at least one of elemental tungsten, a tungsten alloy, tungsten silicide and tungsten nitride, where the conductor metal layer is different in composition from conductive metal nitride layer 54. An exemplary tungsten alloy is titanium-tungsten. In the depicted example, conductor metal layer 56 is received over conductive metal nitride layer 54 (and "on" such layer as shown, meaning in at least some physical contacting relationship therewith). However, in a lesser preferred embodiment, the invention contemplates the reverse whereby conductive metal nitride layer 54 is received over a conductor metal layer, including on such layer.

Regardless, exemplary preferred conductive metal nitride layers are those described above in connection with preferred storage node materials. An exemplary preferred thickness range for conductive metal nitride layer 54 is from 100 Angstroms to 300 Angstroms, with 200 Angstroms being a specific preferred example.

Conductor metal layer 56 might be received over all (not shown) of each individual of storage node electrodes 48 of the plurality of memory cell capacitors as in the prior art described in the "Background" section. Alternately as shown, conductor metal layer 56 is received over only a portion of each individual of storage node electrodes 48 of capacitors 16 and 18. For example and by way of example only, conductor metal layer 56 is shown as not being received over a central portion 60 of storage nodes 48 at the base of the depicted container shapes. Further preferably as shown, conductive metal nitride layer 54 is received over all of each individual of the storage node electrodes 48 of at least some of the plurality of memory cell capacitors, with layer 54 being shown as being received over all of storage node electrodes 48 of capacitors 16 and 18. An exemplary preferred thickness range for conductor metal layer 56 is from 100 Angstroms to 1,000 Angstroms.

In the depicted preferred embodiment, polysilicon 62 is received over both of conductive metal nitride layer 54 and conductor metal layer 56, with conductive metal nitride layer 54, conductor metal layer 56 and polysilicon 62 being received over storage node electrodes 48 of memory cell capacitors 16 and 18. Further in one preferred embodiment, and where conductor metal layer 56 is received over a conductive metal nitride layer 54, polysilicon 62 is received on the at least one of elemental tungsten, tungsten alloy, tungsten silicide or tungsten nitride of conductor metal layer 56. Further in the depicted embodiment, particularly where conductor metal layer 56 is received over only a portion of each individual of storage node electrodes 48, polysilicon 62 is also received on conductive metal nitride 54. If conductor metal layer 56 is received over all of each individual of storage node electrodes 48 of the plurality of memory cell capacitors, polysilicon 62 might be received on only one of the conductive metal nitride layer or conductor metal layer. Regardless, an exemplary preferred thickness range for polysilicon 62 is from 50 Angstroms to 600 Angstroms, and preferably fills the remaining volume of the depicted storage node container shapes. Further in the depicted preferred embodiment, polysilicon 62 is laterally co-extensive with conductive metal nitride 54, at least within memory array 15, for example as shown in FIG. 2.

Polysilicon 62 might be conductively doped with a conductivity enhancing impurity, for example whereby polysilicon 62 might comprise an operative electrically conductive part or portion of the cell electrode. Alternately by way of example only, the polysilicon might be doped with a conductivity enhancing impurity insufficient to render the polysilicon effectively conductive to comprise a conductive part of the cell electrode, and in one embodiment, might not be conductively doped with any conductivity enhancing impurity.

Regardless, the invention also contemplates polysilicon being received over conductor metal layer 56 (whether such is partially as depicted or wholly as not depicted received over each individual storage node electrode) even if, or regardless of whether, conductive metal nitride layer 54 is present. However, the depicted FIG. 2 embodiment is preferred where such layer is present, and conductor metal layer 56 is received over conductive metal nitride layer 54.

Figure 3:
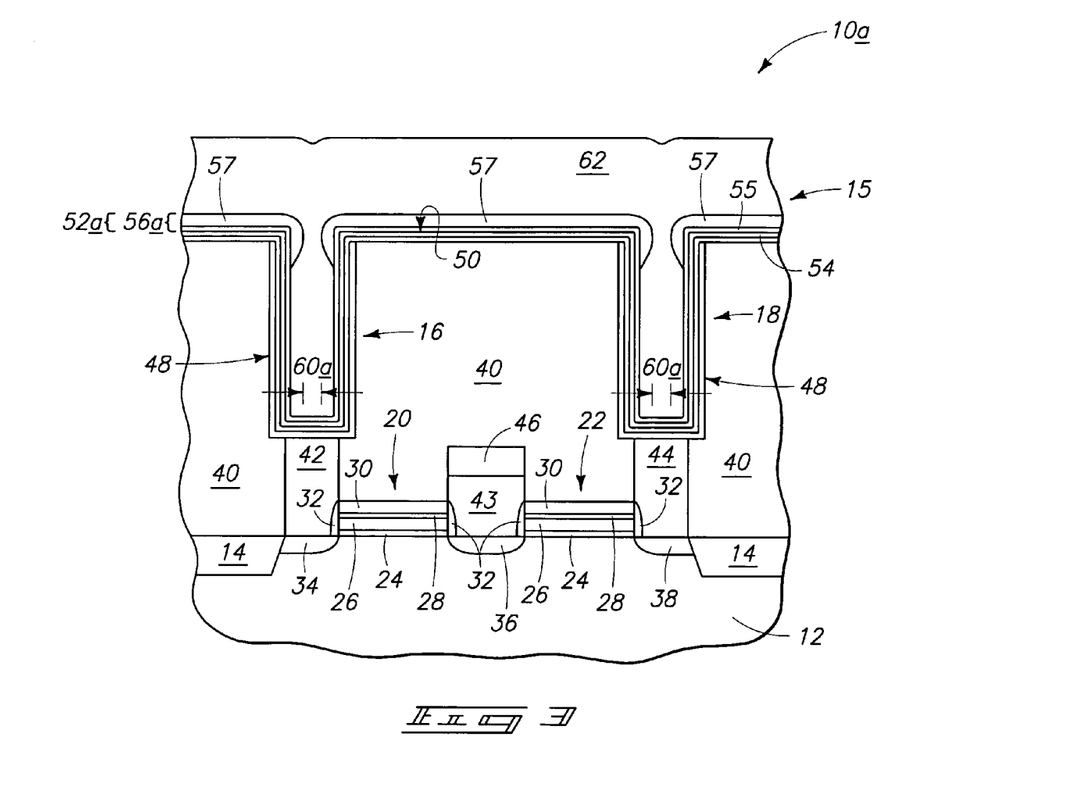
FIG. 3 is an alternate embodiment view to that depicted by FIG. 2.

Further by way of example only, the invention contemplates the conductor metal layer comprising at least two of elemental tungsten, a tungsten alloy, tungsten silicide and tungsten nitride, including any two, three or four thereof. By way of example only, FIG. 3 depicts an alternate embodiment semiconductor wafer fragment 10*a*. Like numerals from the first described embodiment are utilized where appropriate, with differences being indicated with the suffix "a", or with different numerals. FIG. 3 depicts a cell electrode 52*a* comprising a conductor metal layer 56*a* comprised of two layers 55 and 57 comprising any two of elemental tungsten, a tungsten alloy, tungsten silicide and tungsten nitride. Other preferred attributes are as describe above, and of course, three or four of such layers (including more of other layers) might be utilized.

Utilization of polysilicon in the prior art, and as described herein, has been determined to reduce dielectric leakage, and it is believed that the polysilicon provides a stress buffer or blocks oxidation of titanium nitride and tungsten silicide during processing subsequent to the formation of the depicted capacitors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; and
the cell electrode within the memory array comprising a conductor metal layer comprising at least one of elemental tungsten, a tungsten alloy, tungsten silicide and tungsten nitride; polysilicon being received over the conductor metal layer; the conductor metal layer and the polysilicon being received over the storage node electrodes of said at least some of the plurality of memory cell capacitors, the polysilicon not comprising a conductive part of the cell electrode.

2. The memory circuitry of claim 1 wherein the conductor metal layer comprises elemental tungsten.

3. The memory circuitry of claim 1 wherein the conductor metal layer comprises tungsten silicide.

4. The memory circuitry of claim 1 wherein the conductor metal layer comprises tungsten nitride.

5. The memory circuitry of claim 1 wherein the conductor metal layer comprises a tungsten alloy.

6. The memory circuitry of claim 1 wherein the conductor metal layer comprises at least two of elemental tungsten, a tungsten alloy, tungsten silicide and tungsten nitride.

7. The memory circuitry of claim 1 wherein the polysilicon is not conductively doped with any conductivity enhancing impurity.

8. The memory circuitry of claim 1 wherein the polysilicon is received on at least one of the elemental tungsten, tungsten alloy, tungsten silicide or tungsten nitride of the conductor metal layer.

9. The memory circuitry of claim 1 wherein the capacitor dielectric region comprises at least one of aluminum oxide and hafnium oxide.

10. The memory circuitry of claim 1 wherein the cell electrode comprises a conductive metal nitride different in composition from and in addition to the conductor metal layer.

11. The memory circuitry of claim 10 wherein the polysilicon is received on the conductive metal nitride.

12. The memory circuitry of claim 1 wherein,
the storage node electrodes comprise a conductive metal nitride; and
the capacitor dielectric region comprises at least one of aluminum oxide and hafnium oxide.

13. The memory circuitry of claim 1 comprising DRAM circuitry.

14. The memory circuitry of claim 1 wherein the storage node electrodes of said at least some of the plurality of memory cell capacitors comprise a container shape, with the polysilicon filling last-remaining volume of said container shape.

15. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; and
the cell electrode within the memory array comprising a conductor metal layer comprising at least one of elemental tungsten, a tungsten alloy, tungsten silicide and tungsten nitride; the cell electrode comprising a conductive metal nitride different in composition from and in addition to the conductor metal layer; polysilicon being received over the conductor metal layer and over the conductive metal nitride; the conductor metal layer and the polysilicon being received over the storage node electrodes of said at least some of the plurality of memory cell capacitors; the polysilicon being received on the conductive metal nitride and on at least one of the elemental tungsten, tungsten alloy, tungsten silicide or tungsten nitride of the conductor metal layer.

16. The memory circuitry of claim 15 wherein the polysilicon is substantially laterally coextensive with the conductive metal nitride at least within the memory array.

17. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; and
the cell electrode within the memory array comprising a conductor metal layer comprising at least one of elemental tungsten, a tungsten alloy, tungsten silicide and tungsten nitride; polysilicon being received over the conductor metal layer; the conductor metal layer and the polysilicon being received over the storage node electrodes of said at least some of the plurality of memory cell capacitors, the conductor metal layer being received over only a portion of each individual of said storage node electrodes of said at least some of the plurality of memory cell capacitors.

18. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; and
the cell electrode within the memory array comprising a conductor metal layer comprising at least one of elemental tungsten, a tungsten alloy, tungsten silicide and tungsten nitride; polysilicon being received over the conductor metal layer; the conductor metal layer and the polysilicon being received over the storage node electrodes of said at least some of the plurality of memory cell capacitors, the storage node electrodes of said at least some of the plurality of memory cell capacitors comprising a container shape, the conductor metal layer being received over only a portion of each container shape of said storage node electrodes of said at least some of the plurality of memory cell capacitors.

19. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array;
the cell electrode within the memory array comprising:
a conductive metal nitride layer; and
a conductor metal layer comprising at least one of elemental tungsten, a tungsten alloy, tungsten silicide and tungsten nitride; the conductor metal layer being different in composition from the conductive metal nitride layer; and
polysilicon received over both of the conductive metal nitride layer and the conductor metal layer; the conductive metal nitride layer, the conductor metal layer and the polysilicon being received over the storage node electrodes of said at least some of the plurality of memory cell capacitors, the polysilicon not comprising a conductive part of the cell electrode.

20. The memory circuitry of claim 19 wherein the polysilicon is substantially laterally coextensive with the conductive metal nitride layer at least within the memory array.

21. The memory circuitry of claim 19 wherein the conductor metal layer is received over the conductive metal nitride layer.

22. The memory circuitry of claim 21 wherein the conductor metal layer is received on the conductive metal nitride layer.

23. The memory circuitry of claim 19 wherein the conductive metal nitride layer is received over the conductor metal layer.

24. The memory circuitry of claim 23 wherein the conductive metal nitride layer is received on the conductor metal layer.

25. The memory circuitry of claim 19 wherein the polysilicon is received on at least one of: a) the conductive metal nitride layer, and b) at least one of the elemental tungsten, tungsten alloy, tungsten silicide or tungsten nitride of the conductor metal layer.

26. The memory circuitry of claim 25 wherein the polysilicon is received on the conductive metal nitride layer.

27. The memory circuitry of claim 25 wherein the polysilicon is received on the at least one of the elemental tungsten, tungsten alloy, tungsten silicide or tungsten nitride of the conductor metal layer.

28. The memory circuitry of claim 19 wherein the polysilicon is received on only one of: a) the conductive metal nitride layer, and b) at least one of the elemental tungsten, tungsten alloy, tungsten silicide or tungsten nitride of the conductor metal layer.

29. The memory circuitry of claim 28 wherein the polysilicon is received on the conductive metal nitride layer.

30. The memory circuitry of claim 28 wherein the polysilicon is received on the at least one of the elemental tungsten, tungsten alloy, tungsten silicide or tungsten nitride of the conductor metal layer.

31. The memory circuitry of claim 19 wherein the conductor metal layer comprises elemental tungsten.

32. The memory circuitry of claim 19 wherein the conductor metal layer comprises tungsten silicide.

33. The memory circuitry of claim 19 wherein the conductor metal layer comprises tungsten nitride.

34. The memory circuitry of claim 19 wherein the conductor metal layer comprises a tungsten alloy.

35. The memory circuitry of claim 19 wherein the conductor metal layer comprises at least two of elemental tungsten, a tungsten alloy, tungsten silicide and tungsten nitride.

36. The memory circuitry of claim 19 wherein the polysilicon is not conductively doped with any conductivity enhancing impurity.

37. The memory circuitry of claim 21 wherein the polysilicon is substantially laterally coextensive with the conductive metal nitride layer at least within the memory array.

38. The memory circuitry of claim 19 wherein the storage node electrodes of said at least some of the plurality of memory cell capacitors comprise a container shape, with the polysilicon filling last-remaining volume of said container shape.

39. The memory circuitry of claim 19 comprising DRAM circuitry.

40. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array;
the cell electrode within the memory array comprising:

a conductive metal nitride layer; and
a conductor metal layer comprising at least one of elemental tungsten, a tungsten alloy, tungsten silicide and tungsten nitride; the conductor metal layer being different in composition from the conductive metal nitride layer; and
polysilicon received over both of the conductive metal nitride layer and the conductor metal layer; the conductive metal nitride layer, the conductor metal layer and the polysilicon being received over the storage node electrodes of said at least some of the plurality of memory cell capacitors, the polysilicon being received on both of: a) the conductive metal nitride layer, and b) at least one of the elemental tungsten, tungsten alloy, tungsten silicide or tungsten nitride of the conductor metal layer.

41. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array;
the cell electrode within the memory array comprising:
a conductive metal nitride layer; and
a conductor metal layer comprising at least one of elemental tungsten, a tungsten alloy, tungsten silicide and tungsten nitride; the conductor metal layer being different in composition from the conductive metal nitride layer; and
polysilicon received over both of the conductive metal nitride layer and the conductor metal layer; the conductive metal nitride layer, the conductor metal layer and the polysilicon being received over the storage node electrodes of said at least some of the plurality of memory cell capacitors, the conductor metal layer being received over only a portion of each individual of said storage node electrodes of said at least some of the plurality of memory cell capacitors.

42. The memory circuitry of claim 41 wherein the conductive metal nitride layer is received over all of each individual of said storage node electrodes of said at least some of the plurality of memory cell capacitors.

43. The memory circuitry of claim 41 wherein,
the conductor metal layer is received over the conductive metal nitride layer; and
the conductive metal nitride layer is received over all of each individual of said storage node electrodes of said at least some of the plurality of memory cell capacitors.

44. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array;
the cell electrode within the memory array comprising:
a conductive metal nitride layer; and
a conductor metal layer comprising at least one of elemental tungsten, a tungsten alloy, tungsten silicide and tungsten nitride; the conductor metal layer being different in composition from the conductive metal nitride layer; and
polysilicon received over both of the conductive metal nitride layer and the conductor metal layer; the conductive metal nitride layer, the conductor metal layer and the polysilicon being received over the storage node electrodes of said at least some of the plurality of memory cell capacitors, the storage node electrodes of said at least some of the plurality of memory cell capacitors comprising a container shape, the conductor metal layer being received over only a portion of each container shape of said storage node electrodes of said at least some of the plurality of memory cell capacitors.

45. The memory circuitry of claim 44 wherein the conductive metal nitride layer is received over all of each individual of said storage node electrodes of said at least some of the plurality of memory cell capacitors.

46. The memory circuitry of claim 44 wherein,
the conductor metal layer is received over the conductive metal nitride layer; and
the conductive metal nitride layer is received over all of each individual of said storage node electrodes of said at least some of the plurality of memory cell capacitors.

47. Memory circuitry comprising:
a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; the storage node electrodes being of a container shape and received within container openings formed within an insulative silicate glass;
the cell electrode within the memory array comprising:
a conductive metal nitride layer having a container shape;
a conductor metal layer received on the conductive metal nitride layer, the conductive metal layer comprising at least one of elemental tungsten, a tungsten alloy, tungsten silicide and tungsten nitride in contact with the conductive metal nitride layer; the conductor metal layer being different in composition from the conductive metal nitride layer; and
polysilicon received on both of a) the at least one of the elemental tungsten, tungsten alloy, tungsten silicide or tungsten nitride of the conductor metal layer and, b) the conductive metal nitride layer; the conductive metal nitride layer, the conductor metal layer and the polysilicon being received over the storage node electrodes of said at least some of the plurality of memory cell capacitors; the polysilicon filling last-remaining volume of said container shapes of the storage node electrodes.

48. The memory circuitry of claim 47 wherein the conductor metal layer comprises elemental tungsten.

49. The memory circuitry of claim 47 wherein the conductor metal layer comprises tungsten silicide.

50. The memory circuitry of claim 47 wherein the conductor metal layer comprises tungsten nitride.

51. The memory circuitry of claim 47 wherein the conductor metal layer comprises a tungsten alloy.

52. The memory circuitry of claim 47 wherein the conductor metal layer comprises at least two of elemental tungsten, a tungsten alloy, tungsten silicide and tungsten nitride.

53. The memory circuitry of claim 47 wherein the polysilicon is conductively doped with a conductivity enhancing impurity.

54. The memory circuitry of claim 47 wherein the polysilicon is not conductively doped with any conductivity enhancing impurity.

55. The memory circuitry of claim 47 wherein the polysilicon is substantially laterally coextensive with the conductive metal nitride layer at least within the memory array.

56. Memory circuitry comprising:

a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; the storage node electrodes being of a container shape and received within container openings formed within an insulative silicate glass;

the cell electrode within the memory array comprising:
  a conductive metal nitride layer having a container shape;
  a conductor metal layer received on the conductive metal nitride layer, the conductive metal layer comprising at least one of elemental tungsten, a tungsten alloy, tungsten silicide and tungsten nitride in contact with the conductive metal nitride layer; the conductor metal layer being different in composition from the conductive metal nitride layer; and polysilicon received on the at least one of the elemental tungsten, tungsten alloy, tungsten silicide or tungsten nitride of the conductor metal layer; the conductive metal nitride layer, the conductor metal layer and the polysilicon being received over the storage node electrodes of said at least some of the plurality of memory cell capacitors; the polysilicon filling last-remaining volume of said container shapes of the storage node electrodes, the polysilicon not comprising a conductive part of the cell electrode.

57. Memory circuitry comprising:

a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; the storage node electrodes being of a container shape and received within container openings formed within an insulative silicate glass;

the cell electrode within the memory array comprising:
  a conductive metal nitride layer having a container shape;
  a conductor metal layer received on the conductive metal nitride layer, the conductive metal aver comprising at least one of elemental tungsten, a tungsten alloy, tungsten silicide and tungsten nitride in contact with the conductive metal nitride layer; the conductor metal layer being different in composition from the conductive metal nitride layer; and polysilicon received on the at least one of the elemental tungsten, tungsten alloy, tungsten silicide or tungsten nitride of the conductor metal layer; the conductive metal nitride layer, the conductor metal layer and the polysilicon being received over the storage node electrodes of said at least some of the plurality of memory cell capacitors; the polysilicon filling last-remaining volume of said container shapes of the storage node electrodes, the conductor metal layer being received over only a portion of each individual of said storage node electrodes of said at least some of the plurality of memory cell capacitors.

58. Memory circuitry comprising:

a memory array comprising a plurality of memory cell capacitors, individual of the capacitors comprising a storage node electrode, a capacitor dielectric region, and a cell electrode; the cell electrode being commonly shared among at least some of the plurality of memory cell capacitors within the memory array; the storage node electrodes being of a container shape and received within container openings formed within an insulative silicate glass;

the cell electrode within the memory array comprising:
  a conductive metal nitride layer having a container shape;
  a conductor metal layer received on the conductive metal nitride layer, the conductive metal layer comprising at least one of elemental tungsten, a tungsten alloy, tungsten silicide and tungsten nitride in contact with the conductive metal nitride layer; the conductor metal layer being different in composition from the conductive metal nitride layer; and polysilicon received on the at least one of the elemental tungsten, tungsten alloy, tungsten silicide or tungsten nitride of the conductor metal layer; the conductive metal nitride layer, the conductor metal layer and the polysilicon being received over the storage node electrodes of said at least some of the plurality of memory cell capacitors; the polysilicon filling last-remaining volume of said container shapes of the storage node electrodes;

the polysilicon being substantially laterally coextensive with the conductive metal nitride layer at least within the memory array; and the conductor metal layer being received over only a portion of each individual of said storage node electrodes of said at least some of the plurality of memory cell capacitors.

* * * * *

UNITED STATES PATENT AND TRADEMARK OFFICE
CERTIFICATE OF CORRECTION

| | | |
|---|---|---|
| PATENT NO. | : 7,126,182 B2 | Page 1 of 1 |
| APPLICATION NO. | : 10/918613 | |
| DATED | : October 24, 2006 | |
| INVENTOR(S) | : Graettinger | |

It is certified that error appears in the above-identified patent and that said Letters Patent is hereby corrected as shown below:

Col. 8, line 50, claim 37, please delete "21" after "claim" and insert --19--.

Col. 11, line 48, claim 57, please delete "aver" after "metal" and insert --layer--.

Signed and Sealed this

Twenty-first Day of August, 2007

JON W. DUDAS
*Director of the United States Patent and Trademark Office*